(12) United States Patent
Kobayashi et al.

(10) Patent No.: US 8,338,926 B2
(45) Date of Patent: Dec. 25, 2012

(54) LEAD FRAME FOR OPTICAL SEMICONDUCTOR DEVICES, METHOD OF PRODUCING THE SAME, AND OPTICAL SEMICONDUCTOR DEVICE

(75) Inventors: Yoshiaki Kobayashi, Tokyo (JP); Kazuhiro Koseki, Tokyo (JP); Shin Kikuchi, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 13/168,192

(22) Filed: Jun. 24, 2011

(65) Prior Publication Data

US 2011/0293926 A1      Dec. 1, 2011

Related U.S. Application Data

(63) Continuation of application No. PCT/JP2009/071504, filed on Dec. 24, 2009.

(30) Foreign Application Priority Data

Dec. 26, 2008 (JP) .................................. 2008-332732

(51) Int. Cl.
*H01L 23/495* (2006.01)
(52) U.S. Cl. ............ 257/676; 257/88; 257/762; 438/123
(58) Field of Classification Search .................... 257/88, 257/676, 762; 438/123
See application file for complete search history.

(56) References Cited

U.S. PATENT DOCUMENTS

| | | | | |
|---|---|---|---|---|
| 6,943,433 | B2 * | 9/2005 | Kamada | 257/666 |
| 7,692,277 | B2 * | 4/2010 | Tomohiro et al. | 257/677 |
| 7,994,616 | B2 * | 8/2011 | Tomohiro et al. | 257/677 |
| 2008/0006911 | A1 | 1/2008 | Nakahara et al. | |
| 2008/0054287 | A1 | 3/2008 | Oshio et al. | |
| 2008/0083973 | A1 | 4/2008 | Yamada et al. | |
| 2009/0141498 | A1 | 6/2009 | Kawanobe et al. | |

FOREIGN PATENT DOCUMENTS

| | | |
|---|---|---|
| JP | 61-14883 A | 7/1986 |
| JP | 2005-129970 A | 5/2005 |
| JP | 2006-303069 A | 11/2006 |
| JP | 2007-258647 A | 10/2007 |
| JP | 2008-16674 A | 1/2008 |
| JP | 2008-53564 A | 3/2008 |
| JP | 2008-60344 A | 3/2008 |
| JP | 2008-91818 A | 4/2008 |
| JP | 2009-135355 A | 6/2009 |

OTHER PUBLICATIONS

International Search Report, dated Feb. 2, 2010 in PCT/JP2009/071504.

* cited by examiner

*Primary Examiner* — Jarrett Stark
*Assistant Examiner* — Nicholas Tobergte
(74) *Attorney, Agent, or Firm* — Birch, Stewart, Kolasch & Birch, LLP

(57) ABSTRACT

A lead frame for optical semiconductor devices in which a layer 2 composed of silver or a silver alloy is formed on an electrically-conductive substrate 1, having: a surface layer 4 composed of a metal or alloy thereof excellent in corrosion resistance as an outermost layer, wherein a concentration of a metallic component excellent in corrosion resistance of the surface layer is 50% by mass or more at the uppermost portion of the surface layer, and wherein a solid-solution layer 3 of silver and a metallic material which is a main component of the surface layer is formed between the surface layer and the layer composed of silver or a silver alloy.

12 Claims, 2 Drawing Sheets

LEAD FRAME FOR OPTICAL SEMICONDUCTOR DEVICES, METHOD OF PRODUCING THE SAME, AND OPTICAL SEMICONDUCTOR DEVICE

CROSS REFERENCE TO RELATED APPLICATIONS

This application is a Continuation of copending PCT International Application No. PCT/JP2009/071504 filed on Dec. 24, 2009, which claims priority of Application Ser. No. 2008-332732 filed in Japan on Dec. 26, 2008, all of which are hereby expressly incorporated by reference into the present application.

TECHNICAL FIELD

The present invention relates to a lead frame for optical semiconductor devices, a method of producing the same, and an optical semiconductor device.

BACKGROUND ART

Lead frames for optical semiconductor devices have been widely used in constitution parts of light sources for various display and lighting, in which light-emitting elements of optical semiconductor elements, such as LEDs (light-emitting diodes), are utilized as the light sources. Such an optical semiconductor device is produced by, for example, arranging a lead frame on a substrate, mounting a light-emitting element on the lead frame, and sealing the light-emitting element and its surrounding with a resin, to prevent deterioration of the light-emitting element and its surrounded region by external factors, such as heat, humidity, and oxidization.

When a LED is used as a light source for lighting, there is a demand for reflective materials for lead frames to have a high reflectance (e.g. reflectance 80% or more) in the whole regions of visible light wavelength (400 to 700 nm). Further, LEDs have been recently used as light sources for measurement/analytical equipments using ultraviolet rays, and there is a demand for the reflective materials to have a high reflectance in a wavelength of around 300 nm. Thus, in optical semiconductor devices to be used as light sources for lighting, the reflection property of reflective materials is a very important factor upon which product performance depends.

In order to cope with this demand, on a lead frame corresponding to the portion beneath a LED, there is often formed a layer (film) composed of silver or a silver alloy, for enhancing reflectance of light (hereinafter referred to reflectance). For example, known techniques include: forming of a silver plated layer formed on a reflection plane (Patent Literature 1); and forming a silver or silver alloy layer with grain diameter of 0.5 µm to 30 µm, by subjecting the layer to heat treatment at 200° C. or higher for 30 seconds or longer (Patent Literature 2).

However, as in the technique described in Patent Literature 1, in the case where the layer of silver or a silver alloy is simply formed on a lead frame, reflectance of light at a region of the vicinity of wavelength 300 nm to 400 nm corresponding to the near-ultraviolet region is conspicuously lowered. Furthermore, there is such a problem that migration is apt to occur in pure silver. On the other hand, as in the technique described in Patent Literature 2, in the case where the layer is formed to have grain diameter of 0.5 µm or more, the reflectance of light in the visible light region is somewhat improved. However, as is seen in the technique described in Patent Literature 1, reflectance is conspicuously lowered, with respect to light of the near-ultraviolet region.

Furthermore, the inventors of the present invention found that, when such a lead frame described in Patent Literatures 1 and 2 was utilized in an optical semiconductor device using a LED, luminance was deteriorated with the lapse of time. We further found that this was caused by a sulfur contamination contained even in a small amount in the resin for sealing the LED and the surrounding, which sulfur caused sulfuration of the silver due to the heat generated upon light emission from the LED, to change the color of the silver to black.

In order to solve this problem, there is a method of preventing sulfuration of silver in a film composed of silver or a silver alloy by applying a coating of various noble metals to the film. For example, a method was proposed, in which a palladium layer is formed in a thickness of 0.005 to 0.15 µm on a nickel underlying layer, and a rhodium layer is formed in a thickness of 0.003 to 0.05 µm as an outermost layer, to improve reflectance (Patent Literature 3). However, a lead frame formed by such a method is inferior to a lead frame with the film composed of silver or a silver alloy in reflectance, and it is difficult to achieve a level of 80% or more of reflectance which is required in a visible light region as a light source for lighting. Because of the presence of a portion whose reflectance is lower by 20% or more than that of a silver layer particularly in a rhodium layer, required characteristics of reflectance in blue-color or white-color optical semiconductor devices have not been satisfied.

CITATION LIST

Patent Literatures

Patent Literature 1: JP-A-61-148883 ("JP-A" means unexamined published Japanese patent application)
Patent Literature 2: JP-A-2008-016674
Patent Literature 3: JP-A-2005-129970

SUMMARY OF INVENTION

Technical Problem

An object of the present invention is to provide a lead frame for optical semiconductor devices favorable in the reflection characteristics particularly in the near-ultraviolet region, by which luminance is not deteriorated for a long period of time. Another object of the present invention is to provide a method of producing the lead frame for optical semiconductor devices. Further object of the present invention is to provide an optical semiconductor device.

Solution to Problem

The inventors of the present invention, having studied keenly the above problems, have found that a lead frame for semiconductor devices excellent in long-term stability of the reflection characteristics in the near-ultraviolet region can be obtained, by forming the surface layer composed of a metal or alloy thereof excellent in corrosion resistance, on the surface of a layer composed of silver or a silver alloy; by controlling the concentration of the metallic component excellent in corrosion resistance of the surface layer to be 50% by mass or more at the uppermost portion of the surface layer, and the layer thickness thereof to be from 0.001 to 0.25 µm; and by forming a solid-solution layer between the surface layer and the layer composed of silver or a silver alloy. Based on the finding, we have attained the present invention.

That is, the above problem is solved by the following means:

(1) A lead frame for optical semiconductor devices in which a layer composed of silver or a silver alloy is formed on an electrically-conductive substrate, comprising: a surface layer composed of a metal or alloy thereof excellent in corrosion resistance as an outermost layer, wherein a concentration of a metallic component excellent in corrosion resistance of the surface layer is 50% by mass or more at the uppermost portion of the surface layer, and a layer thickness thereof is from 0.001 to 0.25 µm, and wherein a solid-solution layer of silver and a metallic material which is a main component of the surface layer is formed between the surface layer and the layer composed of silver or a silver alloy.

(2) The lead frame for optical semiconductor devices according to item (1), wherein the solid-solution layer contains the metallic component which mainly forms the surface layer, and the metallic component has concentration distribution from the side of the surface layer to the side of the layer composed of silver or a silver alloy.

(3) The lead frame for optical semiconductor devices according to item (2), wherein the concentration distribution of the metallic component in the solid-solution layer is high at the side of the surface layer and is low at the sides of the surface layer and the layer composed of silver or a silver alloy.

(4) The lead frame for optical semiconductor devices according to any one of items (1) to (3), wherein the electrically-conductive substrate is composed of copper, a copper alloy, aluminum, or an aluminum alloy.

(5) The lead frame for optical semiconductor devices according to any one of items (1) to (4), further comprising at least one intermediate layer composed of a metal or alloy selected from the group consisting of nickel, a nickel alloy, cobalt, a cobalt alloy, copper, and a copper alloy, between the electrically-conductive substrate and the layer composed of silver or a silver alloy.

(6) The lead frame for optical semiconductor devices according to any one of items (1) to (5), wherein the layer composed of silver or a silver alloy has a thickness of 0.2 to 5.0 µm.

(7) The lead frame for optical semiconductor devices according to any one of items (1) to (6), wherein the surface layer is formed of a material capable of forming a solid solution with silver or a silver alloy at ordinary temperature. Herein, the term ordinary temperature means 25° C.

(8) The lead frame for optical semiconductor devices according to any one of items (1) to (7), wherein a metal or alloy thereof excellent in corrosion resistance of the surface layer is selected from the group consisting of gold, a gold alloy, indium, an indium alloy, palladium, a palladium alloy, tin, and a tin alloy.

(9) A method of producing the lead frame for optical semiconductor devices according to any one of items (1) to (8), comprising: forming the surface layer on the surface of the layer composed of silver or a silver alloy; and conducting heat treatment at a temperature of 100° C. or more and within a temperature range not exceeding a temperature capable of forming a solid solution of a material for forming the surface layer with silver or a silver alloy, to make the material for forming the surface layer diffuse to the inside of the layer composed of silver or a silver alloy.

(10) A method of producing the lead frame for optical semiconductor devices according to any one of items (1) to (8), comprising: forming the layer composed of silver or a silver alloy through electroplating.

(11) A method of producing the lead frame for optical semiconductor devices according to item (5), comprising: forming the layer composed of silver or a silver alloy and the intermediate layer through electroplating.

(12) An optical semiconductor device, wherein the lead frame for optical semiconductor devices according to any one of items (1) to (8) is provided at least a portion on which an optical semiconductor element is mounted.

Herein, in the present invention, the terminology "metal or alloy thereof excellent in corrosion resistance" means one which does not cause discoloration, after being retained in the air containing hydrogen sulfide ($H_2S$) for 24 hours, in a sulfuration test (please refer to JISH 8502-1999). Specifically, it means a metal or alloy which has a rating number (RN) of 9 or more after the sulfuration test in which the metal or alloy is retained in the air containing 3% by volume of hydrogen sulfide for 24 hours.

Advantageous Effects of Invention

The lead frame of the present invention has a favorable reflection characteristics of silver or a silver alloy, is excellent in the adhesion property, and can ensure a favorable electrical conductivity, by forming the surface layer composed of a metal or alloy thereof excellent in corrosion resistance as the outermost layer, by forming a solid-solution layer of silver contained in the layer composed of silver or a silver alloy without forming an intermetallic compound, and by allowing to remain as silver or a silver alloy in the lower layer. These effects allow for production of the lead frame for optical semiconductor devices higher in long-term reliability.

Other and further features and advantages of the invention will appear more fully from the following description, appropriately referring to the accompanying drawings.

DESCRIPTION OF EMBODIMENTS

Figure 1:
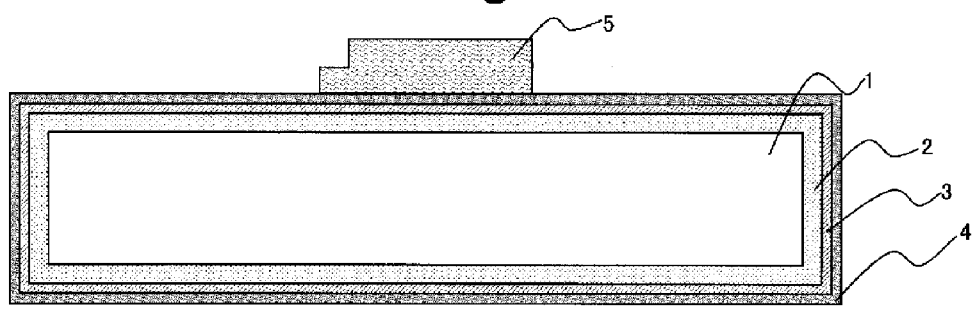
FIG. 1 is a cross-sectional view schematically illustrating an embodiment of the lead frame for optical semiconductor devices according to the present invention.

In the lead frame of the present invention, as an outermost layer, the surface layer composed of a metal or alloy thereof excellent in corrosion resistance is formed, on the surface of the layer composed of silver or a silver alloy, thereby allowing suppression of deterioration of the reflectance of light in the near-ultraviolet region. The reflectance of the light, particularly near a wavelength of 300 nm, is as low as about several percents, when only the layer composed of silver or a silver alloy is provided on the electrically-conductive substrate. Contrary to the above, the surface layer composed of a metal or alloy thereof excellent in corrosion resistance is formed on the surface of the layer composed of silver or a silver alloy, the reflectance can be improved to several tens of percents.

Further, in the lead frame of the present invention, by forming the surface layer composed of a metal or alloy thereof excellent in corrosion resistance as the outermost layer, the layer composed of silver or a silver alloy is not exposed. Thus, a possibility is reduced in which silver is eluted to cause migration by an influence of humidity or the like, thereby causing a short-circuit accident in the formed circuit. Since the surface layer composed of a metal or alloy thereof excellent in corrosion resistance is formed on the surface of the layer composed of silver or a silver alloy, sulfuration of the layer composed of silver or a silver alloy can be suppressed. Thus, discoloration of the layer composed of silver or a silver alloy is suppressed. Based on these actions, when the lead frame of the present invention is used for the optical semiconductor element, for example, a LED, even if the optical semiconductor device is made to emit light (lighting) for a long period of time of 10,000 hours or more, a decrease of luminance of the optical semiconductor device can be suppressed to about several percents.

Further, by forming the solid-solution layer of silver and the metallic material which is a main component of the surface layer, between the surface layer and the layer composed of silver or a silver alloy, the adhesion strength between the surface layer and the layer composed of silver or a silver alloy is also enhanced. This is because, in the solid-solution layer, the main metallic component which forms the surface layer has concentration distribution from the side of the surface layer to the side of the layer composed of silver or a silver alloy, and thus the lattice distortion between the surface layer and the layer composed of silver or a silver alloy is relaxed, to improved the matching property, thereby to improve the adhesion property.

That is, the lead frame of the present invention is favorable in the reflectance property in a wide wavelength band from the near-ultraviolet region to the near-infrared region, and can be used as a lead frame for optical semiconductor devices with a high long-term reliability.

Herein, when the surface layer is formed of an alloy, any alloy system can be used, as long as it is capable of forming the solid-solution layer with the layer composed of silver or a silver alloy. For example, a tin (Sn)-gold (Au) alloy can be selected as the surface layer. In this case, the surface layer of a Sn—Au layer and the solid-solution layer of an Ag—Sn—Au layer are formed, by forming a tin layer on the layer composed of silver or a silver alloy, forming a gold layer on the tin layer, and conducting an appropriate heat treatment.

Further, in the lead frame of the present invention, by controlling the concentration of the metal excellent in corrosion resistance contained in the surface layer to be 50% by mass or more at the uppermost portion of the surface layer, it is possible to suppress discoloration of the layer composed of silver or a silver alloy upon bonding with a sulfur component. The concentration of the metal excellent in corrosion resistance which is contained in the uppermost portion of the surface layer is more preferably 65% by mass or more. Herein, the term "uppermost portion" in the present invention means a portion at a distance of 0.0005 to 0.001 μm from the surface of the surface layer to the inside. The metal concentration of the portion can be measured by quantitative analysis with an AES analyzer, as one described in the following Examples.

On the other hand, the metal excellent in corrosion resistance is involved in the formation of the solid-solution layer to be described hereinafter. With respect to the ratio of the metal to be diffused in the layer composed of silver or a silver alloy to accelerate the formation of the solid-solution layer, the ratio is preferably 5 to 50% by mass, more preferably 5 to 35% by mass, and further preferably 5 to 15% by mass, to the amount of the metal in the coated outermost layer. Since the formed solid solution may not be present in the uppermost portion of the surface layer, the concentration of the metal excellent in corrosion resistance contained in the uppermost portion of the surface layer may be 100% by mass, excluding inevitable impurities.

In the lead frame of the present invention, since the solid-solution layer contains the main metallic component which forms the surface layer and the metallic component has concentration distribution from the side of the surface layer to the side of the surface layer and the layer composed of silver or a silver alloy, the adhesion property between the surface layer and the layer composed of silver or a silver alloy is improved, and the internal stress by heat or lattice distortion is relaxed, thereby improving heat resistance. Further, by having the concentration distribution, the level of sulfuration to be caused by a reaction of a sulfur component, which has entered the inside through pinholes present on the surface layer or the surface after losing the surface layer due to plastic deformation, for example, by pressing, with silver or a silver alloy, can be reduced even in the depth direction, thereby further improving corrosion resistance.

Further, by forming the electrically-conductive substrate with copper, a copper alloy, aluminum, or an aluminum alloy, the lead frame of the present invention can be made to have a favorable reflectance property, forming of the layers on the surface thereof can be conducted readily, and the production costs can be lowered. Furthermore, the lead frame of the present invention whose electrically-conductive substrate is formed with copper, a copper alloy, aluminum, or an aluminum alloy, is excellent in the heat releasing property (heat dissipation), this is because the generated heat (thermal energy) that is generated upon emission by the light-emitting element can be released or dissipated smoothly to the outside via the lead frame. Based on those, the long service life of the light-emitting element and the long-term stability of the reflectance property can be expected.

Further, in the lead frame of the present invention, at least one intermediate layer composed of a metal or alloy selected from the group consisting of nickel, a nickel alloy, cobalt, a cobalt alloy, copper, and a copper alloy is formed, between the electrically-conductive substrate and the layer composed of silver or a silver alloy. Thus, it is possible to prevent deterioration of the reflectance property caused by diffusion of the material for forming the electrically-conductive substrate to the layer composed of silver or a silver alloy due to heat generated when the light-emitting element emits light; the reflectance property becomes highly reliable over a long period of time; and the adhesion property between the substrate and the layer composed of silver or a silver alloy is also improved. The thickness of the intermediate layer can be determined, taking the pressing property, the production costs, the productivity, the heat resistance, and the like, into consideration. Under the general conditions, the total thickness of the intermediate layers is preferably 0.2 to 2 μm and more preferably 0.5 to 1 μm. The intermediate layer may be formed of a plurality of layers, but, in general, the number of intermediate layers is preferably 2 or less, taking the productivity into consideration.

Further, in the lead frame of the present invention, the thickness of the layer composed of silver or a silver alloy is preferably set in a range of 0.2 to 5.0 µm, to ensure long-term reliability, favorable reflectance property, and favorable pressing and bending properties. When the thickness is too thin, the reflection property becomes insufficient, while when the thickness is too thick, cracks are apt to occur upon pressing or bending.

Further, it is preferable to select a metal or alloy thereof excellent in heat resistance to be used for the surface layer of the lead frame of the present invention, from the group consisting of gold, a gold alloy, indium, an indium alloy, palladium, a palladium alloy, tin, and a tin alloy, to enable for giving favorable corrosion resistance and productivity. From the viewpoint of reliability, setting the surface layer thickness to a range of 0.001 to 0.25 µm allows long-term reliability to be ensured, without lowering of the reflectance of light. This is because when the thickness of the surface layer is too thin, corrosion resistance and an improvement effect on reflectance in wavelength 300 nm become insufficient, and, when the thickness of the surface layer is too thick, the reflectance in the visible light region becomes insufficient and the bending property becomes poor.

Furthermore, the method of producing the lead frame of the present invention includes: forming the surface layer, on the surface of the layer composed of silver or a silver alloy; conducting heat treatment at a temperature of 100° C. or more and within a temperature range not exceeding a temperature capable of forming a solid solution between a material for forming the surface layer and pure silver, to make the remaining components diffuse to the inside of the layer composed of silver or a silver alloy, to accelerate the formation of the solid solution, while making the material for forming the surface layer and the metallic component excellent in corrosion resistance of the surface layer remain in the outermost layer at the above-described concentration; and conducting solution treatment. The temperature at the heat treatment is preferably 100 to 300° C., and it is necessary to select the temperature that the base material is not softened and deteriorated upon the heat treatment. It is preferable that the heat treatment is conducted in a time period within a range of 0.25 to 48 hours. The method of the heat treatment can be appropriately selected, for example, from batch treatment and in-line treatment.

The heat-treatment is conducted preferably under an inert or reducing atmospheric gas, such as argon, nitrogen, and carbon monoxide, since oxidization of the surface layer may be accelerated to occur as the oxygen concentration in the atmosphere becomes higher. More preferably, it is preferable to set the residual oxygen in the atmosphere to 1,000 ppm or less. However, when the uppermost portion is covered with an oxide layer by an influence of a slight amount of residual oxygen in the heat treatment, it is preferable, for example, to immerse in a reducing acid (e.g. dilute sulfuric acid and dilute hydrochloric acid) after the heat treatment, to remove the oxide layer by cathode electrolysis. Since the oxide layer is several angstroms, any adverse affection on the characteristics is not caused even if the removal process is conducted. Rather, the surface is activated and the effect of improvement on the wire-bonding property can be obtained.

Further, in the method of producing the lead frame of the present invention, by forming the layer composed of silver or a silver alloy through electroplating, it is possible to adjust the thickness of the layer composed of silver or a silver alloy readily. Examples of another forming method include cladding and sputtering, but the control of the thickness is difficult when using these methods and the production costs become high. Since the electroplating can form many grain boundaries in the layer composed of silver or a silver alloy to be formed, this is effective in forming a solid-solution layer by diffusion.

Further, in the optical semiconductor device of the present invention, the lead frame of the present invention is used for the portion on which at least an optical semiconductor element is mounted, and thus the reflectance property can be efficiently obtained at a low cost. This is because, if deterioration of the layer composed of silver or a silver alloy can be prevented, by forming the surface layer on only a mounted portion of the optical semiconductor element, the reflectance property is not largely affected. For example, as for a part which is subjected to resin sealing, the layer composed of silver or a silver alloy may be exposed to the surface. In this case, the surface layer may be partially formed on the layer composed of silver or a silver alloy, and it may be formed by partial plating, such as stripe plating or spot plating. Production of the lead frame with the thus-partially-formed layer makes it possible to cut the amount of metal for use at an unnecessary portion, and thus the resultant optical semiconductor device can be friendly to the environment and can achieve reduction of the production costs. Herein, when the layer composed of silver or a silver alloy is exposed to the surface, solder wettability is readily ensured, and effects useful in mounting can be obtained.

FIG. 1 is a cross-sectional view schematically illustrating an embodiment of the lead frame for optical semiconductor devices according to the present invention. FIG. 1 shows a state in which an optical semiconductor element 5 is mounted on the lead frame (the same will be applied to FIGS. 2 to 8 in the below).

As shown in FIG. 1, the lead frame of the present embodiment has: a layer 2 composed of silver or a silver alloy which is formed on an electrically-conductive substrate 1; a surface layer 4 which is composed of a metal or alloy thereof excellent in corrosion resistance, as the outermost layer; a solid-solution layer 3 composed of silver and a metallic material which is the main component of the surface layer, which solid-solution layer is formed between the surface layer 4 and the layer 2 composed of silver or a silver alloy; and the optical semiconductor element 5 which is mounted on a partial surface of the surface layer 4. In the present invention, the lead frame of the present invention is a lead frame for optical semiconductor devices, which is excellent in the reflection property of the near-ultraviolet to visible regions, and is excellent in corrosion resistance and long-term reliability.

The electrically-conductive substrate 1 may be formed using, for example, by copper, a copper alloy, aluminum, an aluminium alloy, iron, or an iron alloy. The substrate excellent in the heat releasing property is preferably composed of a metal or alloy selected from the group consisting of copper, a copper alloy, aluminum, and an aluminium alloy. The use of copper, a copper alloy, aluminum, or an aluminium alloy for forming the electrically-conductive substrate 1 makes the formation of the surface layer 4 readily, thereby providing a lead frame which can contribute to a cost reduction. Furthermore, the lead frame is excellent in the heat releasing property because of favorable heat transfer coefficient which is associated with favorable electrical conductivity, since the generated heat (thermal energy) that is generated upon emission by the optical semiconductor element can be released smoothly to the outside via the lead frame. Owing to those, the long service life of the light-emitting element and the long-term stability of the reflectance property can be expected.

Further, in the present invention, the term "favorable reflection property (or reflectance property)" means that the reflectance in the visible light region with wavelength not less than 400 nm is 80% or more, and the reflectance in the near-ultraviolet region with wavelength less than 400 nm is 30% or more. As long as the reflectance in the visible light region with wavelength not less than 400 nm is not less than 70%, the reflection property may be acceptable, depending on the use.

The thickness of the layer 2 composed of silver or a silver alloy is preferably 0.2 to 5.0 µm, more preferably 1.0 to 3.0 µm. This thickness can be realized by adjusting the coating thickness of the layer 2 composed of silver or a silver alloy, and thus the lead frame can be produced at a low cost without using a noble metal more than necessary. When the thickness of the layer 2 composed of silver or a silver alloy is too thin, contribution to the reflectance is not sufficient. On the other hand, when the thickness is too thick, the cost becomes high since the effect is saturated.

Examples of the silver alloy to be used for the layer composed of silver or a silver alloy include a silver-tin alloy, a silver-indium alloy, a silver-rhodium alloy, a silver-ruthenium alloy, a silver-gold alloy, a silver-palladium alloy, a silver-nickel alloy, a silver-selenium alloy, a silver-antimony alloy, a silver-copper alloy, a silver-zinc alloy, and a silver-bismuth alloy. It is preferable to select from the group consisting of a silver-tin alloy, a silver-indium alloy, a silver-rhodium alloy, a silver-ruthenium alloy, a silver-gold alloy, a silver-palladium alloy, a silver-nickel alloy, a silver-selenium alloy, a silver-antimony alloy, and a silver-copper alloy.

The formation of these alloys is relatively readily. Although they are inferior to pure silver, they can achieve a reflectance of 80% or more in the visible light region. Thus, favorable reflection property for the light in a wide wavelength region can be obtained. Alloying makes sulfuration of silver hard to occur, and further corrosion resistance is maintained. When the content of silver in a silver alloy becomes too low, the reflectance falls conspicuously, and thus the content of silver is preferably 80% by mass or more.

As mentioned above, the long-term reliability of silver or a silver alloy can be ensured, by forming the surface layer 4 composed of a metal or alloy thereof excellent in corrosion resistance as the outermost layer, so that the concentration of the metallic component excellent in corrosion resistance at the uppermost portion would be 50% by mass or more, preferably 65% by mass or more.

The lead frame of the present invention can be produced, by forming the layer 2 composed of silver or a silver alloy on the electrically-conductive substrate 1, forming the surface layer 4, and conducting heat treatment at a temperature of 100° C. or more and within a temperature range not exceeding a temperature capable of forming a solid solution of a material for forming the surface layer 4, with silver or a silver alloy. It is preferable that the layer 2 composed of silver or a silver alloy is formed through electroplating. Further, as the optical semiconductor element 5, use may be made of any arbitral optical semiconductor element, such as a LED.

Figure 2:
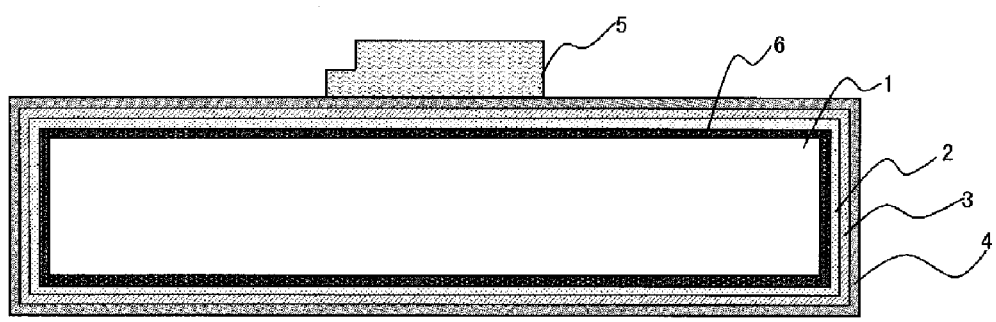
FIG. 2 is a cross-sectional view schematically illustrating another embodiment of the lead frame for optical semiconductor devices according to the present invention.

FIG. 2 is a cross-sectional view schematically illustrating another embodiment of the lead frame for optical semiconductor devices according to the present invention, in which an intermediate layer 6 is provided between the electrically-conductive substrate 1 and the layer 2 composed of silver or a silver alloy, in the lead frame of the embodiment illustrated in FIG. 1.

The intermediate layer 6 is preferably composed of a metal or alloy selected from the group consisting of nickel, a nickel alloy, cobalt, a cobalt alloy, copper, and a copper alloy.

By providing the intermediate layer 6 composed of nickel, a nickel alloy, cobalt, a cobalt alloy, copper, or a copper alloy, between the electrically-conductive substrate 1 and the layer 2 composed of silver or a silver alloy, it is possible to prevent deterioration of the reflectance property due to diffusion of the material constituting the electrically-conductive substrate into the layer composed of silver or a silver alloy, by the heat generated from the optical semiconductor element, and to achieve a long-term, highly-reliable reflectance property.

Figure 3:
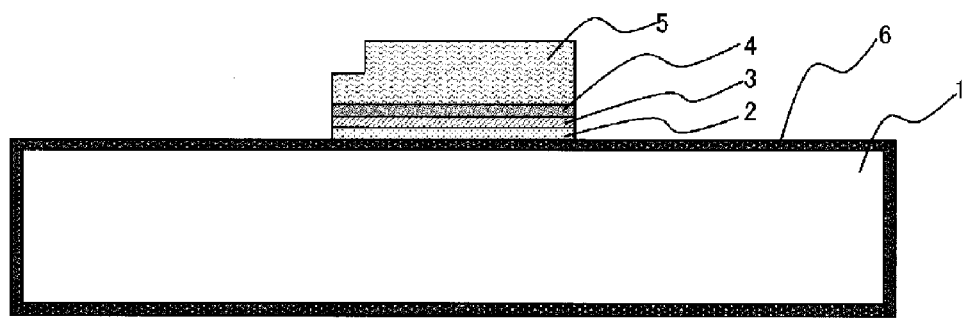
FIG. 3 is a cross-sectional view schematically illustrating yet another embodiment of the lead frame for optical semiconductor devices according to the present invention.

FIG. 3 is a cross-sectional view schematically illustrating yet another embodiment of the lead frame for optical semiconductor devices according to the present invention, and shows a state in which the surface layer 4, the solid-solution layer 3, and the layer 2 composed of silver or a silver alloy are formed at only a portion on which the optical semiconductor element 5 is mounted. In the present invention, in this way, the surface layer 4, the solid-solution layer 3, and the layer 2 composed of silver or a silver alloy can be formed only at a portion which may cause the problem of changing its color to black. In the present embodiment, the intermediate layer 6 is formed on the whole surface of the electrically-conductive substrate 1. The intermediate layer 6 may be partially formed thereon as long as it lies between the electrically-conductive substrate 1 and the layer 2 composed of silver or a silver alloy.

Herein, the reference signs or numerals not particularly referred to in the explanation for FIG. 3, each have the same meanings as those in FIGS. 1 and 2 (the same will be applied to the following figures).

Figure 4:
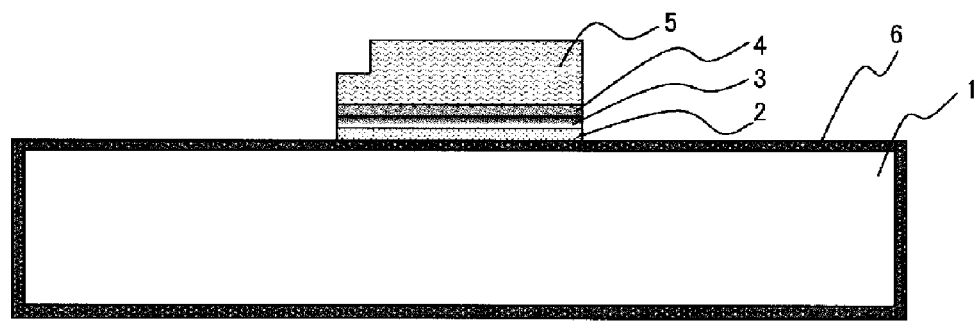
FIG. 4 is a cross-sectional view schematically illustrating yet another embodiment of the lead frame for optical semiconductor devices according to the present invention.

FIG. 4 is a cross-sectional view schematically illustrating yet another embodiment of the lead frame for optical semiconductor devices according to the present invention. Similarly to the lead frame for optical semiconductor devices shown in FIG. 3, the surface layer 4, the solid-solution layer 3, and the layer 2 composed of silver or a silver alloy are formed only at a portion on which the optical semiconductor element 5 is mounted. Furthermore, in the solid-solution layer 3, the main metallic component which constitutes the surface layer 4 has the concentration distribution from the side of the surface layer 4 to the side of the layer 2 composed of silver or a silver alloy.

Figure 5:
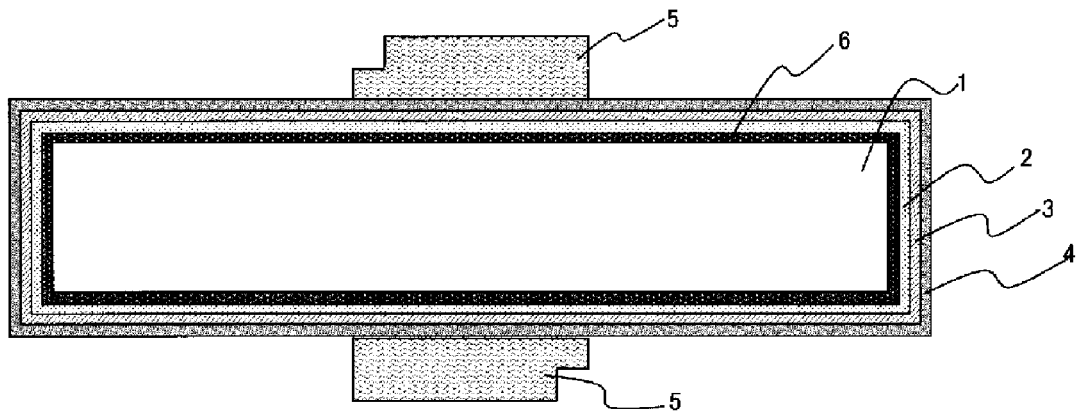
FIG. 5 is a cross-sectional view schematically illustrating yet another embodiment of the lead frame for optical semiconductor devices according to the present invention.

FIG. 5 is a cross-sectional view schematically illustrating the lead frame for optical semiconductor devices, which is similar to the embodiment illustrated in FIG. 2. In FIG. 5, the respective optical semiconductor element 5 is mounted on each surface of the lead frame. As in this embodiment, the optical semiconductor device may be formed, using both of the surfaces of the lead frame, not only one side thereof.

Figure 6:
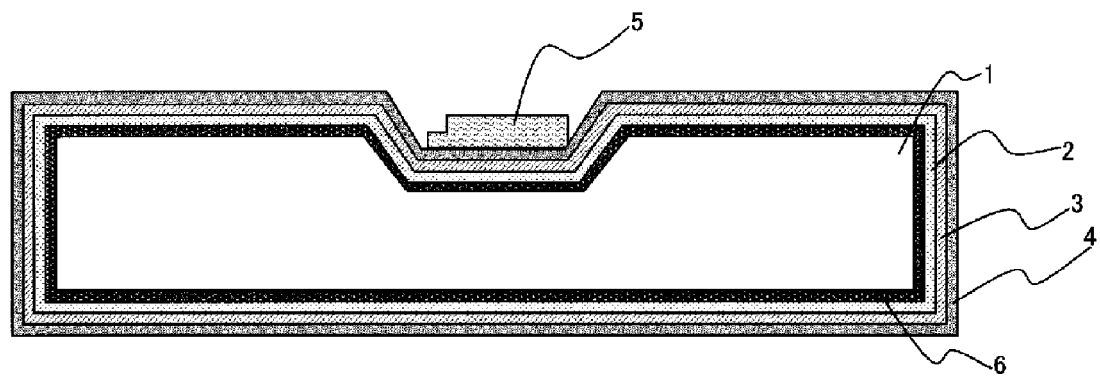
FIG. 6 is a cross-sectional view schematically illustrating yet another embodiment of the lead frame for optical semiconductor devices according to the present invention.

FIG. 6 is a cross-sectional view schematically illustrating yet another embodiment of the lead frame for optical semiconductor devices according to the present invention, in which a recess is provided in the electrically-conductive substrate 1 and the optical semiconductor element 5 is mounted at the inside of the recess. As in this embodiment, the lead frame for optical semiconductor devices of the present invention can also be applied to such a shape of lead frame that the recess is provided to improve the light-concentrating property.

Figure 7:
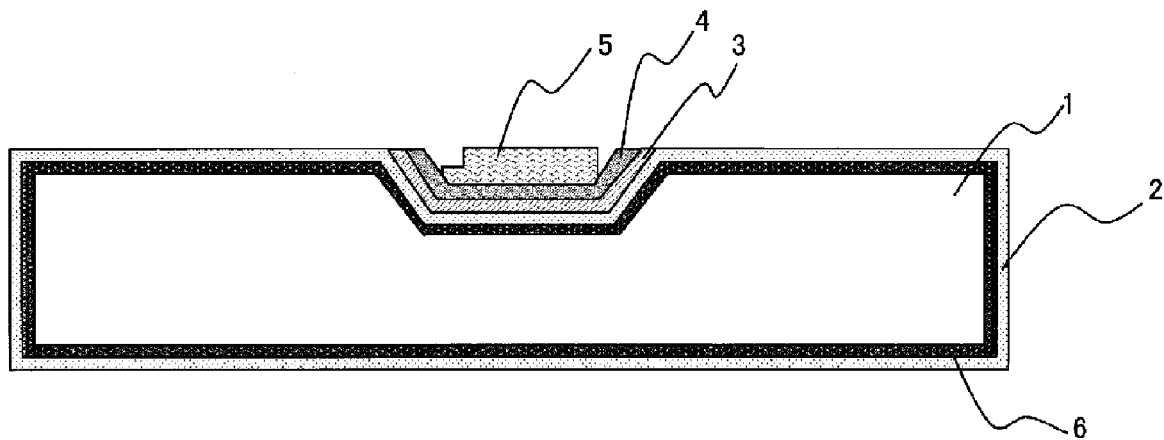
FIG. 7 is a cross-sectional view schematically illustrating yet another embodiment of the lead frame for optical semiconductor devices according to the present invention.

FIG. 7 is a cross-sectional view schematically illustrating yet another embodiment of the lead frame for optical semiconductor devices according to the present invention, in which a recess is provided in the electrically-conductive substrate 1, the optical semiconductor element 5 is mounted at the inside of the recess, and the surface layer 4 and the solid-solution layer 3 are formed only at the recess. In this way, in the lead frame having a recess, as the layer 4 and the solid-solution layer 3 are provided only at the portion contributing to the reflection of light emitted by the optical semiconductor element, it is also possible to improve the corrosion resistance only at the reflecting part appropriately.

Production of the lead frame for optical semiconductor devices may be carried out by any method, but the layer 2 composed of silver or a silver alloy, the surface layer 4, and the intermediate layer 6 are preferably formed by electroplating.

EXAMPLES

The present invention will be described in more detail based on examples given below, but the invention is not meant to be limited by these.

Example No. 1

In Example No. 1, the respective electrically-conductive substrate, as shown in Table 1, with thickness 0.3 mm and width 50 mm, was subjected to the following pretreatments, and the following electroplating, thereby to obtain the respective lead frame of Examples 1 to 31 according to the present invention (Ex.), Conventional example 1 (Conv. ex.), and Comparative examples 1 and 2 (Comp. ex.), having the respective structure as shown in Table 1.

With respect to the layer structure of each lead frame, in Examples 1 to 5 according to the present invention, the electrically-conductive substrate, the layer composed of silver or a silver alloy, the solid-solution layer, and the surface layer were formed in this order. In Examples 6 to 31 according to the present invention and Comparative examples 1 to 2, the electrically-conductive substrate, the intermediate layer, the layer composed of silver or a silver alloy, the solid-solution layer, and the surface layer were formed in this order. In Conventional example 1, the electrically-conductive substrate, the intermediate layer, and the layer composed of silver or a silver alloy were formed in this order.

As shown in Table 1, the thickness of the intermediate layer, the thickness of the layer composed of silver or a silver alloy (shown as "Ag layer thickness"), and the thickness of the surface layer, each represent an average value of thicknesses (arithmetic average of measured values at arbitrary ten points). The thickness of each layer was measured using a fluorescent-X-ray film thickness measuring apparatus (trade name: SFT9400, manufactured by Seiko Instruments Inc. (SII)).

Herein, out of materials used in the electrically-conductive substrates, "C19400", "C11000", "C26800", "C52100", and "C77000" represent copper or copper alloy substrates, and the numerical values following C indicate types based on CDA (Copper Development Association) standards.

Further, "A1100", "A2014", "A3003", and "A5052" represent aluminum or aluminum alloy substrates, and the numerical values following A indicate types under JIS.

Furthermore, "SUS304" and "42 alloy" represent iron-based substrates, in which "SUS304" represents stainless steel of the type as stipulated in JIS, and "42 alloy" represents an iron alloy containing NI in an amount of 42%.

As the pretreatments, out of the electrically-conductive substrates, the copper substrate, the copper alloy substrate, and the iron-based substrate were subjected to the following electrolytic degreasing and then to the following acid pickling. On the other hand, the aluminum substrate and the aluminum alloy substrate were subjected to the following electrolytic degreasing, the following acid pickling, and the following zincate conversion. The silver strike plating was conducted to thickness 0.01 μm, before conducting the silver or silver alloy plating.

(Pretreatment Conditions)
[Electrolytic Degreasing]
Degreasing liquid: NaOH 60 g/L
Degreasing conditions: 2.5 A/dm$^2$, temperature 60° C., degreasing time 60 seconds
[Acid Pickling]
Acid pickle: 10% sulfuric acid
Acid pickling conditions: 30 seconds dipping, room temperature
[Zincate conversion] Conducted when the substrate was of aluminum
Zincate conversion liquid: NaOH 500 g/L, ZnO 100 g/L, dihydroxysuccinic acid ($C_4H_6O_6$) 10 g/L, $FeCl_2$ 2 g/L
Treatment conditions: 30 seconds dipping, room temperature
[Ag strike plating] Layer thickness 0.01 μm
Plating liquid: $KAg(CN)_2$ 5 g/L, KCN 60 g/L
Plating conditions: Current density 2 A/dm$^2$, plating time 5 seconds, temperature 25° C.

Compositions of plating liquids and plating conditions in each of the plating applied to in Example No. 1 are described below.

(Plating Conditions)
[Ag Plating]
Plating liquid: AgCN 50 g/L, KCN 100 g/L, $K_2CO_3$ 30 g/l
Plating conditions: Current density 1 A/dm$^2$, temperature 30° C.
[Cu Plating]
Plating liquid: $CuSO_4.5H_2O$ 250 g/L, $H_2SO_4$ 50 g/L, NaCl 0.1 g/L
Plating conditions: Current density 6 A/dm$^2$, temperature 40° C.
[Ni Plating]
Plating liquid: $Ni(SO_3NH_2)_2.4H_2O$ 500 g/L, $NiCl_2$ 30 g/L, $H_3BO_3$ 30 g/L
Plating conditions: Current density 5 A/dm$^2$, temperature 50° C.
[Co Plating]
Plating liquid: $Co(SO_3NH_2)_2.4H_2O$ 500 g/L, $CoCl_2$ 30 g/L, $H_3BO_3$ 30 g/L
Plating conditions: Current density 5 A/dm$^2$, temperature 50° C.
[Au Plating]
Plating liquid: $KAu(CN)_2$ 14.6 g/L, $C_6H_8O_7$ 150 g/L, $K_2C_6H_4O_7$ 180 g/L
Plating conditions: Current density 1 A/dm$^2$, temperature 40° C.
[Au—Co plating] Au-0.3% Co
Plating liquid: $KAu(CN)_2$ 14.6 g/L, $C_6H_8O_7$ 150 g/L, $K_2C_6H_4O_7$ 180 g/L, EDTA-Co(II) 3 g/L, piperazine 2 g/L
Plating conditions: Current density 1 A/dm$^2$, temperature 40° C.
[Pd Plating]
Plating liquid: $Pd(NH_3)_2Cl_2$ 45 g/L, $NH_4OH$ 90 mL/L, $(NH_4)_2SO_4$ 50 g/L
Plating conditions: Current density 1 A/dm$^2$, temperature 30° C.
[Sn Plating]
Plating liquid: $SnSO_4$ 80 g/L, $H_2SO_4$ 80 g/L
Plating conditions: Current density 2 A/dm$^2$, temperature 30° C.
[In Plating]
Plating liquid: $InCl_3$ 45 g/L, KCN 150 g/L, KOH 35 g/L, dextrin 35 g/L
Plating conditions: Current density 2 A/dm$^2$, temperature 20° C.

TABLE 1

|  | Substrate | Intermediate layer | Intermediate layer thickness (μm) | Ag layer thickness (μm) | Surface layer | Surface layer thickness (μm) |
|---|---|---|---|---|---|---|
| Ex. 1 | C26000 | — | — | 1.13 | In | 0.0012 |
| Ex. 2 | C26000 | — | — | 1.17 | In | 0.0048 |
| Ex. 3 | C26000 | — | — | 1.13 | In | 0.012 |
| Ex. 4 | C26000 | — | — | 0.78 | In | 0.108 |
| Ex. 5 | C26000 | — | — | 0.99 | In | 0.248 |
| Ex. 6 | C26000 | Ni | 0.51 | 1.09 | In | 0.035 |
| Ex. 7 | C26000 | Co | 0.49 | 1.15 | In | 0.028 |
| Ex. 8 | C26000 | Cu | 0.52 | 1.21 | In | 0.031 |
| Ex. 9 | C26000 | Ni—Pd | 0.52 | 1.24 | In | 0.03 |
| Ex. 10 | C26000 | Ni | 0.50 | 0.20 | In | 0.028 |
| Ex. 11 | C26000 | Ni | 1.06 | 0.50 | In | 0.028 |
| Ex. 12 | C26000 | Ni | 1.10 | 0.98 | In | 0.029 |
| Ex. 13 | C26000 | Ni | 0.99 | 3.16 | In | 0.027 |
| Ex. 14 | C26000 | Ni | 1.00 | 4.95 | In | 0.026 |
| Ex. 15 | C11000 | Ni | 0.96 | 2.03 | In | 0.028 |
| Ex. 16 | C26800 | Ni | 0.88 | 2.11 | In | 0.031 |
| Ex. 17 | C52100 | Ni | 1.00 | 1.92 | In | 0.033 |
| Ex. 18 | C77000 | Ni | 0.98 | 2.07 | In | 0.03 |
| Ex. 19 | C19400 | Ni | 0.93 | 2.03 | In | 0.034 |
| Ex. 20 | C19400 | Ni | 0.93 | 1.98 | Au | 0.025 |
| Ex. 21 | C19400 | Ni | 0.75 | 1.94 | Au—0.3Co | 0.028 |
| Ex. 22 | C19400 | Ni | 0.77 | 1.99 | Pd | 0.028 |
| Ex. 23 | C19400 | Ni | 0.79 | 2.01 | Sn | 0.027 |
| Ex. 24 | A1100 | Ni | 1.05 | 2.01 | Sn | 0.027 |
| Ex. 25 | A2014 | Ni | 1.06 | 2.08 | Sn | 0.035 |
| Ex. 26 | A3003 | Ni | 1.16 | 2.15 | Sn | 0.032 |
| Ex. 27 | A5052 | Ni | 1.08 | 2.16 | Sn | 0.031 |
| Ex. 28 | SUS304 | Cu | 0.46 | 2.06 | In | 0.11 |
| Ex. 29 | 42 Alloy | Cu | 0.49 | 2.03 | In | 0.13 |
| Ex. 30 | C19400 | Ni | 0.48 | 0.15 | In | 0.01 |
| Ex. 31 | C19400 | Ni | 0.48 | 5.4 | In | 0.01 |
| Conv. ex. 1 | C19400 | Ni | 2.05 | 5.1 | — | — |
| Comp. ex. 1 | C19400 | Ni | 0.51 | 2.11 | Pd | 0.0005 |
| Comp. ex. 2 | C19401 | Ni | 0.55 | 2.2 | Pd | 0.28 |

(Conditions of Forming Solid-Solution Layer)

Under the following conditions, each sample which had been subjected to plating as shown in Table 1, was heat-treated under an argon gas atmosphere with residual oxygen concentration 100 ppm or less, at 100° C. for 12 hours, to form the respective solid-solution layer. The solid solution was formed by this treatment, and then the concentration of the metallic component excellent in corrosion resistance at the uppermost portion of the surface layer was confirmed by an AES analyzer. As a result, the concentration of the metallic component excellent in corrosion resistance was 50% by mass or more in each of the samples.

(Evaluation Method)

The thus-obtained lead frames of Examples according to the present invention, Comparative examples, and Conventional example were evaluated in the following experiments and criteria. The results are shown in Table 2.

(1) Reflectance Measurement:

With a spectrophotometer (U-4100 (trade name, manufactured by Hitachi High-Technologies Corporation)), continuous measurement was made on the total reflectance over wavelengths of 300 nm to 800 nm. Out of the results, the reflectance (%) at 300 nm, 600 nm, and 800 nm are shown in Table 2.

(2) Solid-Solution Layer Thickness:

Analysis in a depth direction was conducted using the AES analyzer (trade name: Model-680, manufactured by ULVAC-PHI), and the thickness of each layer was calculated by converting a sputtering rate into the thickness.

(3) Corrosion Resistance:

The rating number (RN) was evaluated on the corroded state 24 hours after the sulfuration test (as stipulated under JIS H8502), at $H_2S$ 3 ppm. The results are shown in Table 2. Herein, the case where the rating number is 9 or more means that a decrease of luminance is as small as about several percents even if the optical semiconductor element (LED) is lighted up for 10,000 hours.

(4) Reflectance Measurement after the Sulfuration Test:

Reflectance Measurement:

Continuous measurement of the total reflectance over a range of 300 to 800 nm was conducted, with a spectrophotometer (trade name: U-4100, manufactured by Hitachi High-Technologies Corporation). Among them, the reflectance values (%) at 600 nm compared before and after the sulfuration test are shown in Table 2.

(5) Heat Releasing Property (Heat Conductivity):

When the electrical conductivity of the electrically-conductive substrate was 10% or more under IACS (International Annealed Copper Standard), it is judged to be high in the heat releasing property (heat conductivity) and "good", marked with "∘", while when the electrical conductivity was less than 10%, it is judged to be low in the heat releasing property (heat conductivity) and "poor", marked with "x". The results are shown in Table 2. This is because, the electrical conductivity is almost proportional to the heat conductivity, and the electrical conductivity of 10% or more under IACS is determined as favorable in heat conductivity and high in heat releasing property. This item is shown for reference. If a sample satisfies the evaluation on the items (1) to (4), the sample is satisfactory for practical use depending on the selected use.

(6) Bending Property:

From the thus-produced respective lead frame, a sample with length 30 mm and width 10 mm was cut out so that a length direction would be parallel to the rolling direction, and the bending property at bending radius R=0.5 mm was examined with a pressing machine (manufactured by Japan Automatic Machine Co., Ltd.). The maximum bent portion of the thus-worked specimen was observed at a magnification of 175× using a microscope (manufactured by KEYENCE), to judge the bending property. As a result of observation of the maximum bent portion, when no crack was occurred, it is judged as "good", marked with "○", when wrinkles and small cracks were occurred, it is judged to be "fair", marked with "Δ", and when large cracks were occurred, it is judged to be "poor", marked with "x". The results are collectively shown in Table 2. In the evaluation of bending property, the sample which was evaluated as "fair" or "good" was judged as a practically acceptable level. This item is shown for reference. If a sample satisfies the evaluation on the items (1) to (4), the sample is satisfactory for practical use depending on the selected use.

copper, a copper alloy, aluminum or an aluminium alloy, and further forming a specific covering layer as the upper layer thereof. This means that the samples in Examples can be applied to optical semiconductors using the wavelengths, to improve the reflectance in the near-ultraviolet region. Further, it is also found that the lead frame materials were obtained, each of which had little lowering in the reflectance after the sulfuration test and were excellent in the corrosion resistance. It is apparent that when those lead frames in Examples are utilized as the lead frames for optical semiconductor devices, they exhibit extremely excellent reflectance property and long-term reliability.

In Examples 28 and 29, although the heat releasing property is evaluated as "x", they can be appropriately used for a lead frame for optical semiconductor devices which does not mainly require the heat releasing property. In Example 30, the thickness of the silver layer is less than 0.2 μm and thus a

TABLE 2

| | Reflectance (%) | | | | Solid-sol. layer thickness | Corrosion resistance | Reflectance (%) @600 nm after sulfuration | Heat releasing property | Bending property |
|---|---|---|---|---|---|---|---|---|---|
| | @300 nm | @400 nm | @600 nm | @800 nm | (μm) | (RN) | test | (for ref) | (for ref) |
| Ex. 1 | 45 | 89 | 93 | 98 | 0.0006 | 9 | 90 | ○ | ○ |
| Ex. 2 | 44 | 88 | 91 | 95 | 0.0024 | 9.3 | 89 | ○ | ○ |
| Ex. 3 | 45 | 85 | 88 | 93 | 0.0060 | 9.8 | 85 | ○ | ○ |
| Ex. 4 | 44 | 82 | 83 | 93 | 0.0540 | 10 | 80 | ○ | ○ |
| Ex. 5 | 44 | 80 | 85 | 92 | 0.1240 | 10 | 83 | ○ | Δ |
| Ex. 6 | 45 | 84 | 88 | 91 | 0.0175 | 9.8 | 86 | ○ | ○ |
| Ex. 7 | 44 | 83 | 86 | 90 | 0.0140 | 9.8 | 83 | ○ | ○ |
| Ex. 8 | 45 | 84 | 86 | 92 | 0.0155 | 9.8 | 83 | ○ | ○ |
| Ex. 9 | 45 | 83 | 87 | 90 | 0.0150 | 9.5 | 83 | ○ | ○ |
| Ex. 10 | 45 | 80 | 84 | 85 | 0.0140 | 9.8 | 82 | ○ | ○ |
| Ex. 11 | 45 | 81 | 85 | 88 | 0.0140 | 9.8 | 83 | ○ | ○ |
| Ex. 12 | 44 | 82 | 86 | 91 | 0.0145 | 9.5 | 83 | ○ | ○ |
| Ex. 13 | 45 | 82 | 88 | 90 | 0.0135 | 9.8 | 84 | ○ | Δ |
| Ex. 14 | 45 | 83 | 91 | 95 | 0.0130 | 9.8 | 89 | ○ | Δ |
| Ex. 15 | 44 | 83 | 88 | 93 | 0.0140 | 9.8 | 85 | ○ | ○ |
| Ex. 16 | 46 | 83 | 88 | 91 | 0.0155 | 9.5 | 86 | ○ | ○ |
| Ex. 17 | 45 | 83 | 85 | 92 | 0.0165 | 9.8 | 83 | ○ | ○ |
| Ex. 18 | 44 | 84 | 89 | 91 | 0.0150 | 9.8 | 85 | ○ | ○ |
| Ex. 19 | 46 | 83 | 89 | 90 | 0.0170 | 9.8 | 86 | ○ | ○ |
| Ex. 20 | 44 | 81 | 83 | 88 | 0.0125 | 9.8 | 80 | ○ | ○ |
| Ex. 21 | 44 | 81 | 83 | 90 | 0.0140 | 9.5 | 82 | ○ | ○ |
| Ex. 22 | 50 | 80 | 83 | 85 | 0.0140 | 9.8 | 80 | ○ | ○ |
| Ex. 23 | 42 | 80 | 82 | 85 | 0.0135 | 9.8 | 80 | ○ | ○ |
| Ex. 24 | 42 | 80 | 81 | 88 | 0.0135 | 9.8 | 80 | ○ | ○ |
| Ex. 25 | 41 | 80 | 82 | 85 | 0.0175 | 9.5 | 81 | ○ | ○ |
| Ex. 26 | 42 | 81 | 83 | 84 | 0.0160 | 9.8 | 82 | ○ | ○ |
| Ex. 27 | 43 | 80 | 83 | 86 | 0.0155 | 9.8 | 81 | ○ | ○ |
| Ex. 28 | 49 | 81 | 91 | 95 | 0.0550 | 9.8 | 88 | x | ○ |
| Ex. 29 | 47 | 82 | 91 | 95 | 0.0650 | 9.8 | 88 | x | ○ |
| Ex. 30 | 45 | 72 | 75 | 85 | 0.0050 | 9.5 | 72 | ○ | ○ |
| Ex. 31 | 45 | 83 | 91 | 94 | 0.0050 | 9.8 | 88 | ○ | x |
| Conv. ex. 1 | 8 | 91 | 93 | 98 | — | 2 | 27 | ○ | ○ |
| Comp. ex. 1 | 20 | 89 | 91 | 95 | 0.0003 | 5 | 35 | ○ | ○ |
| Comp. ex. 2 | 42 | 50 | 58 | 60 | 0.1400 | 10 | 54 | ○ | Δ |

As is apparent from those results, although the reflectance in the visible light region in Examples according to the present invention was slightly lower than Conventional example in some cases, it is found that Examples each satisfied the reflectance required and were each extremely excellent in the stability after the corrosion resistance test. The reflectance, particularly at 300 nm was several percents at an early stage when only a conventional layer composed of silver or a silver alloy was formed. Contrary to the above, the reflectance at 300 nm in the respective Example was remarkably improved to several tens of percents, by forming the layer composed of silver or a silver alloy on, particularly portion where the reflectance is insufficient is observed, however the corrosion resistance and other characteristics are excellent as compared with Comparative example 1, and it can be appropriately used for a lead frame for optical semiconductor devices by which a reflectance of about 70% is acceptable.

In Example 31, the thickness of the silver layer is greater than 5.0 μm and thus the bending property is evaluated as "x", however other characteristics are excellent as compared with Comparative example 1, and it can be appropriately used for a lead frame for optical semiconductor devices for an application which is not focused on the bending property.

Example No. 2

In Example No. 2, the electrically-conductive substrate composed of a copper alloy of C19400 with thickness 0.3 mm and width 50 mm was subjected to the same pretreatment as in Example No. 1, followed by applying, in each test examples, underlayers of Ni plating 1.0 μm, Ag strike plating 0.01 μm, and Ag plating 3.0 μm, in this order. Then, electroplating was conducted to form a surface layer with layer thickness 0.02 μm of tin (Sn) plating in Examples 32 to 34 and Comparative examples 3 and 4 (Comp. ex.), of indium (In) plating in Example 35, of gold (Au) plating in Example 36 and Comparative example 5, of palladium (Pd) plating in Example 37 and Comparative example 6, respectively. Thus, lead frames of Examples 32 to 37 according to the present invention and Comparative examples 3 to 6 were produced. In Example No. 2, in order to adjust the formation state of the solid-solution layer, the temperature at the heat treatment was adjusted within a range of 100 to 300° C. and the time period for the heat treatment was adjusted within a range of 1 to 24 hours, appropriately and respectively, as shown in Table 3. Then, the changes in the concentration (% by mass) in a depth direction of the metallic component formed on the surface layer were measured by the AES analyzer in the same manner as in Example No. 1, and the results are shown in Table 4. In Table 4, a portion whose concentration of the surface layer metal is 0 (zero), shows that, at the portion, the solid-solution was not formed between the surface layer metal and silver or a silver alloy and the portion was silver or a silver alloy unchanged. Needless to say, these values are analytical concentration detection values of elements in a specific depth, and thus the total of all the numerical values is not necessarily 100%. Further, the results of the corrosion resistance evaluation conducted on those samples are shown in Table 5.

TABLE 3

|  | Temp. at heat treatment (° C.) | Time period at heat treatment (hour) |
|---|---|---|
| Ex. 32 | 100 | 1 |
| Ex. 33 | 200 | 8 |
| Ex. 34 | 250 | 24 |
| Ex. 35 | 150 | 1 |
| Ex. 36 | 150 | 3 |
| Ex. 37 | 150 | 4 |
| Comp. ex. 3 | 350 | 1 |
| Comp. ex. 4 | 200 | 48 |
| Comp. ex. 5 | 200 | 48 |
| Comp. ex. 6 | 200 | 48 |

TABLE 5

|  | Corrosion resistance RN |
|---|---|
| Ex. 32 | 10 |
| Ex. 33 | 9.8 |
| Ex. 34 | 9 |
| Ex. 35 | 9.5 |
| Ex. 36 | 9.5 |
| Ex. 37 | 9.8 |
| Comp. ex. 3 | 5 |
| Comp. ex. 4 | 3 |
| Comp. ex. 5 | 4 |
| Comp. ex. 6 | 3 |

As is apparent from those results, in Examples according to the present invention, the content of the metal excellent in corrosion resistance in the surface layer satisfied the ratio defined in the present invention, and thus the corrosion resistance shows a sufficient value. Contrary to the above, in Comparative example 3, the content of the metal excellent in corrosion resistance in the surface layer was too low, and thus the corrosion resistance is insufficient. In Comparative examples 4 to 6 in which the surface layer disappeared and all of the layers were made to be solid-solutions to have no concentration distribution in the depth direction, the corrosion resistance is similarly poor. As is apparent from the results, when a layer component excellent in corrosion resistance is remained at a specific ratio defined in the present invention and has a concentration distribution, a lead frame for optical semiconductor devices excellent in corrosion resistance can be provided.

Having described our invention as related to the present embodiments, it is our intention that the invention not be limited by any of the details of the description, unless otherwise specified, but rather be construed broadly within its spirit and scope as set out in the accompanying claims.

This non-provisional application claims priority under 35 U.S.C. §119 (a) on Patent Application No. 2008-332732 filed in Japan on Dec. 26, 2008, which is entirely herein incorporated by reference.

Reference Signs List

1 Electrically-conductive substrate

2 Layer composed of silver or a silver alloy

3 Solid-solution layer

4 Surface layer

5 Optical semiconductor element

6 Intermediate layer

TABLE 4

|  | Surface layer | Concentration of surface layer metal (mass %) | | | | | | | |
|---|---|---|---|---|---|---|---|---|---|
|  |  | Uppermost portion @0.001 μm | @0.05 μm | @0.1 μm | @0.2 μm | @0.5 μm | @1.0 μm | @1.5 μm | @2.0 μm |
| Ex. 32 | Sn | 90 | 5 | 0 | 0 | 0 | 0 | 0 | 0 |
| Ex. 33 | Sn | 65 | 10 | 5 | 5 | 5 | 5 | 2.5 | 0 |
| Ex. 34 | Sn | 50 | 15 | 10 | 5 | 5 | 5 | 5 | 5 |
| Ex. 35 | In | 80 | 10 | 5 | 0 | 0 | 0 | 0 | 0 |
| Ex. 36 | Au | 70 | 15 | 5 | 5 | 0 | 0 | 0 | 0 |
| Ex. 37 | Pd | 85 | 10 | 5 | 5 | 0 | 0 | 0 | 0 |
| Comp. ex. 3 | Sn | 30 | 10 | 10 | 10 | 5 | 5 | 0 | 0 |
| Comp. ex. 4 | Sn | 5 | 5 | 5 | 5 | 5 | 5 | 5 | 5 |
| Comp. ex. 5 | Au | 5 | 5 | 5 | 5 | 5 | 5 | 5 | 5 |
| Comp. ex. 6 | Pd | 5 | 5 | 5 | 5 | 5 | 5 | 5 | 5 |

The invention claimed is:

1. A lead frame for optical semiconductor devices in which a layer composed of silver or a silver alloy is formed on an electrically-conductive substrate, comprising: a surface layer composed of a metal or alloy thereof excellent in corrosion resistance as an outermost layer, wherein a concentration of a metallic component excellent in corrosion resistance of the surface layer is 50% by mass or more at the uppermost portion of the surface layer, and a layer thickness thereof is from 0.001 to 0.25 μm, and wherein a solid-solution layer of silver and a metallic material which is a main component of the surface layer is formed between the surface layer and the layer composed of silver or a silver alloy.

2. The lead frame for optical semiconductor devices according to claim 1, wherein the solid-solution layer contains the metallic component which mainly forms the surface layer, and the metallic component has concentration distribution from the side of the surface layer to the side of the layer composed of silver or a silver alloy.

3. The lead frame for optical semiconductor devices according to claim 2, wherein the concentration distribution of the metallic component in the solid-solution layer is high at the side of the surface layer and is low at the sides of the surface layer and the layer composed of silver or a silver alloy.

4. The lead frame for optical semiconductor devices according to claim 1, wherein the electrically-conductive substrate is composed of copper, a copper alloy, aluminum, or an aluminum alloy.

5. The lead frame for optical semiconductor devices according to claim 1, further comprising at least one intermediate layer composed of a metal or alloy selected from the group consisting of nickel, a nickel alloy, cobalt, a cobalt alloy, copper, and a copper alloy, between the electrically-conductive substrate and the layer composed of silver or a silver alloy.

6. The lead frame for optical semiconductor devices according to claim 1, wherein the layer composed of silver or a silver alloy has a thickness of 0.2 to 5.0 μm.

7. The lead frame for optical semiconductor devices according to claim 1, wherein the surface layer is formed of a material capable of forming a solid solution with silver or a silver alloy at ordinary temperature.

8. The lead frame for optical semiconductor devices according to claim 1, wherein a metal or alloy thereof excellent in corrosion resistance of the surface layer is selected from the group consisting of gold, a gold alloy, indium, an indium alloy, palladium, a palladium alloy, tin, and a tin alloy.

9. A method of producing the lead frame for optical semiconductor devices according to claim 1, comprising: forming the surface layer on the surface of the layer composed of silver or a silver alloy; and conducting heat treatment at a temperature of 100° C. or more and within a temperature range not exceeding a temperature capable of forming a solid solution of a material for forming the surface layer with silver or a silver alloy, to make the material for forming the surface layer diffuse to the inside of the layer composed of silver or a silver alloy.

10. A method of producing the lead frame for optical semiconductor devices according to claim 1, comprising: forming the layer composed of silver or a silver alloy through electroplating.

11. A method of producing the lead frame for optical semiconductor devices according to claim 5, comprising: forming the layer composed of silver or a silver alloy and the intermediate layer through electroplating.

12. An optical semiconductor device, wherein the lead frame for optical semiconductor devices according to claim 1 is provided at least a portion on which an optical semiconductor element is mounted.

* * * * *